(12) United States Patent
Xiao et al.

(10) Patent No.: US 8,482,357 B2
(45) Date of Patent: Jul. 9, 2013

(54) TRANSVERSE ACOUSTIC WAVE RESONATOR, OSCILLATOR HAVING THE RESONATOR AND METHOD FOR MAKING THE RESONATOR

(75) Inventors: Bin Xiao, Suzhou (CN); Ping Lv, Suzhou (CN); Wei Hu, Suzhou (CN); Jia-Xin Mei, Suzhou (CN); Gang Li, Suzhou (CN)

(73) Assignee: Memsensing Microsystems Technology Co., Ltd, Suzhou, Jiangsu Province (CN)

( * ) Notice: Subject to any disclaimer, the term of this patent is extended or adjusted under 35 U.S.C. 154(b) by 0 days.

(21) Appl. No.: 13/310,687

(22) Filed: Dec. 2, 2011

(65) Prior Publication Data

US 2013/0093527 A1   Apr. 18, 2013

(30) Foreign Application Priority Data

Oct. 12, 2011  (CN) .......................... 2011 1 0308012

(51) Int. Cl.
*H03B 5/18* (2006.01)

(52) U.S. Cl.
USPC .......... 331/96; 331/107 A; 310/320; 310/321; 310/322; 310/313 R; 310/366

(58) Field of Classification Search
USPC ................ 331/107 A, 96; 310/320, 321, 322, 310/313 R
See application file for complete search history.

(56) References Cited

U.S. PATENT DOCUMENTS

| | | | | |
|---|---|---|---|---|
| 5,414,322 | A | * | 5/1995 | Kosinski et al. .............. 310/366 |
| 5,694,095 | A | * | 12/1997 | Mineyoshi ..................... 333/193 |
| 8,176,784 | B2 | * | 5/2012 | Onoe .............................. 73/579 |

* cited by examiner

*Primary Examiner* — Arnold Kinkead
(74) *Attorney, Agent, or Firm* — Cheng-Ju Chiang

(57) ABSTRACT

A transverse acoustic wave resonator includes a base, a resonator component, a number of driving electrodes fixed to the base and a number of fixing portions connecting the base and the resonator component. The resonator component is suspended above a top surface of the base and is perpendicular to the base. The driving electrodes are coupling to side surfaces of the resonator component. The resonator component is formed in a shape of an essential regular polygon. The driving electrodes and the resonator component jointly form an electromechanical coupling system for converting capacitance into electrostatic force. Besides, a capacitive-type transverse extension acoustic wave silicon oscillator includes the transverse acoustic wave resonator and a method of fabricating the transverse acoustic wave resonator are also disclosed.

20 Claims, 5 Drawing Sheets

TRANSVERSE ACOUSTIC WAVE RESONATOR, OSCILLATOR HAVING THE RESONATOR AND METHOD FOR MAKING THE RESONATOR

BACKGROUND OF THE INVENTION

1. Field of the Invention

The present invention relates to the microelectromechanical system (MEMS) field, and more particularly to a transverse acoustic wave resonator, an oscillator having the resonator and a method for fabricating the resonator.

2. Description of Related Art

Oscillators are electronic components widely used in electrical industries for generating repetitive electrical signals, usually sine waves or square waves. According to different working theories, the oscillators are divided into resistance-capacitance (RC) oscillators, inductance-capacitance (LC) oscillators, quartz crystal oscillators (XOs) and recent MEMS oscillators.

In a long former time, due to excellent stabilities of temperature and frequency and high quality factors, conventional quartz crystal oscillators are applied in almost all electronic products including consumer products, industrial controlling products and military products etc. However, after entering into mobile multimedia times, handset devices bring out the higher demands about the components regarding their energies, profiles and costs. Comparing with the conventional quartz crystal oscillators, the MEMS oscillators, because of their advantages of lower profiles, higher integration rates with CMOS and lower costs, wider and adjustable frequency ranges, are getting more and more preferred in consumer electronics and communication products. American Discera Corporation and Sitime Corporation respectively invent active MEMS oscillators and release related products applied in various kinds of consumer electronics.

An MEMS oscillator usually includes an MEMS resonator, an energizing circuit and a frequency compensation circuit. According to their different capabilities and applied areas, the MEMS oscillators are divided into normal oscillators, voltage-controlled oscillators (VCOs), temperature-controlled oscillators and constant-temperature oscillators etc. According to their different structures of intrinsic capacitive-type resonators, the MEMS oscillators are divided into comb oscillators, clamped beam oscillators, disk oscillators and ring oscillators etc. Besides, according to their different working theories, the MEMS oscillators are divided into surface acoustic wave (SAW) oscillators and bulk wave oscillators among which the bulk wave oscillators, because of their higher quality factors and lower resonance impedance comparing with the SAW oscillators, are becoming the main developing trend in recent research and realizable products.

Hence, it is desirable to provide an improved transverse acoustic wave resonator, an oscillator having the resonator and a method for fabricating the resonator.

BRIEF SUMMARY OF THE INVENTION

The present invention provides a capacitive-type transverse extension acoustic wave silicon oscillator including an energizing circuit, a signal processing circuit and a transverse acoustic wave resonator. The transverse acoustic wave resonator includes a base having a top surface and a bottom surface, a resonator component, a plurality of driving electrodes fixed to the base and a plurality of fixing portions. The resonator component is suspended above the top surface of the base along a vertical direction which is perpendicular to the base. The resonator component includes a plurality of side surfaces. The driving electrodes are coupling to the side surfaces of the resonator component. The fixing portions connect the base and the resonator component. The resonator component is formed in a shape of an essential regular polygon as viewed along the vertical direction. The driving electrodes and the resonator component jointly form an electromechanical coupling system for converting capacitance into electrostatic force so as to oscillate the resonator component.

The present invention provides a method for fabricating a transverse acoustic wave resonator including the following steps:

S1: forming a dielectric layer on a top surface of a single-crystalline silicon via a deposition process;

S2: forming another single-crystalline silicon on a top surface of the dielectric layer via a bonding process;

S3: etching to form a plurality of single-crystalline silicon trenches from a top surface of the another single-crystalline silicon via a dry etching process, and simultaneously, forming a regular polygon resonator component and a plurality of fixing portions connecting the resonator component, the single-crystalline silicon trenches being adapted for setting a plurality of driving electrodes, the single-crystalline silicon trenches and the fixing portions being located peripherally around the resonator component;

S4: forming a sacrificial layer on an inner side of each single-crystalline silicon trench via a deposition process and an etching process, a thickness of the sacrificial layer being the same as a gap between each driving electrode and the resonator component;

S5: forming a polycrystalline-silicon layer on a top surface of a semi-finished product of the step S4 via a deposition process under condition that the polycrystalline-silicon layer fills in the single-crystalline silicon trenches; and S6: removing the polycrystalline-silicon layer which is located on top of the resonator component via a corrosion process, and removing the dielectric layer and the sacrificial layer both of which are located below the resonator component.

The foregoing has outlined rather broadly the features and technical advantages of the present invention in order that the detailed description of the invention that follows may be better understood. Additional features and advantages of the invention will be described hereinafter which form the subject of the claims of the invention.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF THE PREFERRED EMBODIMENTS

Figure 1:
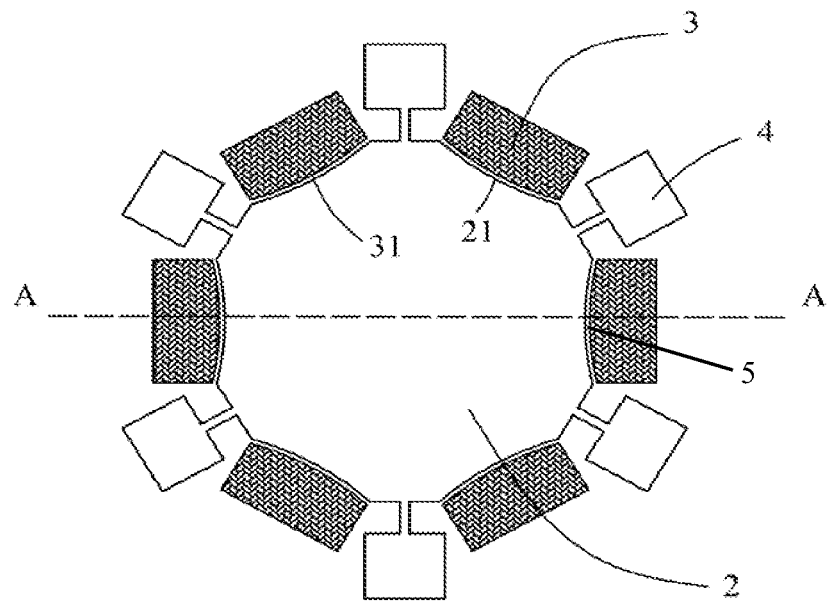
FIG. 1 is a top view of a transverse acoustic wave resonator in accordance with a first embodiment of the present invention showing all components thereof formed in a same plane.

Reference will now be made to the drawing figures to describe the preferred embodiment of the present invention in detail. The illustrated embodiment of the present invention discloses a capacitive-type transverse extension acoustic wave silicon oscillator which includes a transverse acoustic wave resonator, an energizing circuit and a signal processing circuit. Since the energizing circuit and the signal processing circuit are well-known technologies in the art, detailed description thereabout and corresponding drawings thereof are omitted herein.

Referring to FIGS. 1 to 4 and 11, according to the illustrated embodiments of the present invention, the transverse acoustic wave resonator includes a base 1 having a top surface 11 and a bottom surface 12, a cavity 17 recessed inwardly from the top surface 11, a resonator component 2 suspended above the top surface 11 and the cavity 17 along a vertical direction which is perpendicular to the base 1, a plurality of driving electrodes 3 coupling to the resonator component 2 and fixed to the base 1, and a plurality of fixing portions 4 connecting the base 1 and the resonator component 2. The driving electrodes 3 are located peripherally around the resonator component 2, and a plurality of slight gaps 5 are formed between the driving electrode 3 and the resonator component 2. The driving electrodes 3 and the resonator component 2 jointly form an electromechanical coupling system for converting capacitance into electrostatic force so as to oscillate the resonator component 2. The plurality of fixing portions 4 respectively extend away from the resonator component 2 and are coplanar with the resonator component 2.

The resonator component 2 is driven to be movable/oscillatory by the repulsive force generated by the driving electrodes 3 and the resonator component 2. The electromechanical coupling system formed by the driving electrodes 3 and the resonator component 2 together with the energizing circuit form an equivalent negative resistance oscillator circuit. Through driving the resonator component 2 to occur forced oscillation by the driving electrodes 3, capacitance signals between the driving electrodes 3 and the resonator component 2 and meeting the resonance requirement can be outputted into stable frequency signals. Subsequently, requested frequency signals within anticipated scope can be ultimately achieved after processing the prior frequency signals by the signal processing circuit. In other words, the driving electrodes 3 and the resonator component 2 form two plates of a parallel capacitance. When alternating and varying voltage is applied to the driving electrodes 3, lateral sides of the resonator component 2 simultaneously get alternating and varying external force which directs to the centre of an inscribed circle of the resonator component 2. Such external force is perpendicular to the plates of the parallel capacitance so as to compel the resonator component 2 to possibly deform in horizontal directions.

Figure 5:
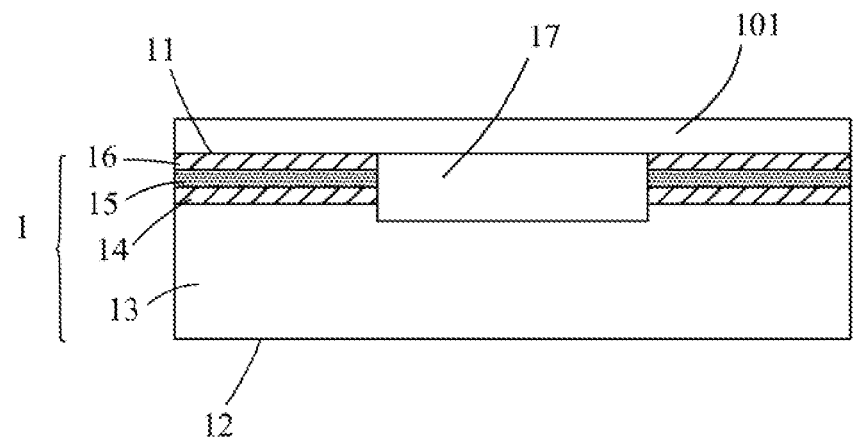
FIG. 5 is a schematic cross-sectional view taken along line A-A of FIG. 1 showing S3 step of a method for fabricating the transverse acoustic wave resonator.

Referring to FIG. 5, the base 1 includes a substrate 13, a first oxide layer 14 covering the substrate 13, an insulating layer 15 covering the first oxide layer 14, a second oxide layer 16 covering the insulating layer 15, and a cavity 17 recessed into the substrate 13 through the first oxide layer 14, the insulating layer 15 and the second oxide layer 16 via an etching technology. The cavity 17 is adapted for easily fabricating the transverse acoustic wave resonator. However, the cavity 17 can be omitted in other embodiments.

Figure 2:
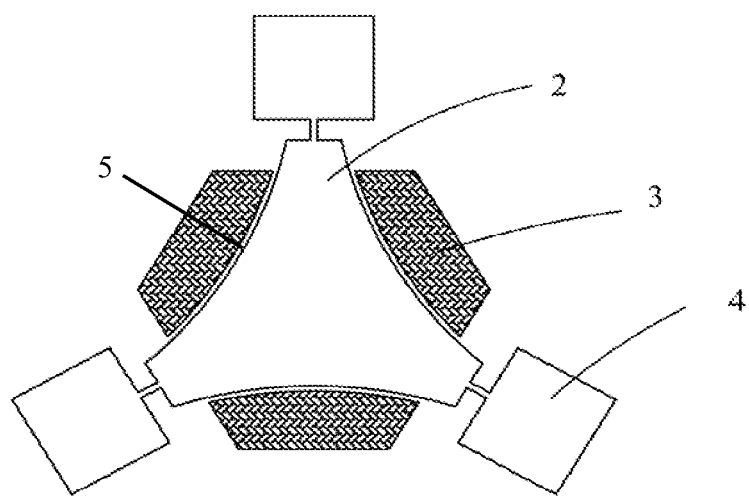
FIG. 2 is a top view of a transverse acoustic wave resonator in accordance with a second embodiment of the present invention.
Figure 3:
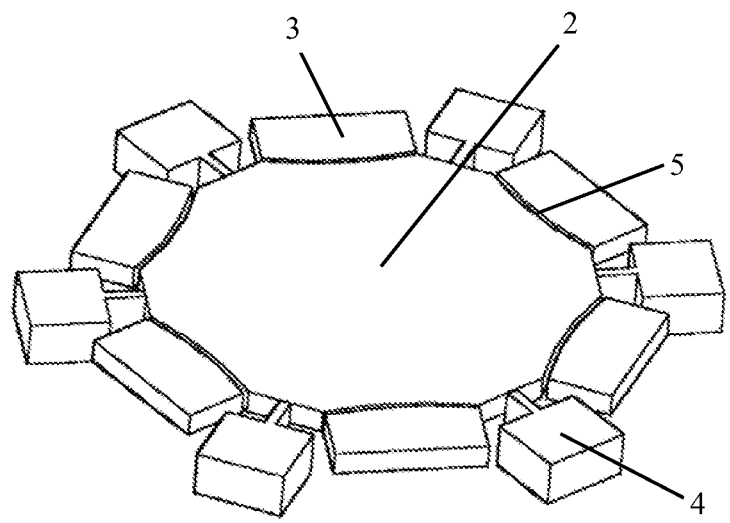
FIG. 3 is a perspective view of the transverse acoustic wave resonator as shown in FIG. 1 showing all components thereof formed in the same plane.
Figure 4:
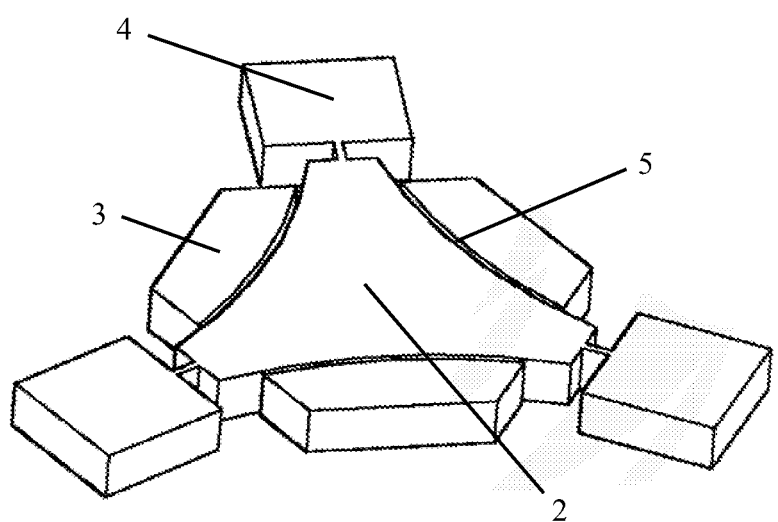
FIG. 4 is a perspective view of the transverse acoustic wave resonator as shown in FIG. 2.

Referring to FIGS. 1 and 3, the resonator component 2 is formed in a shape of an essential regular hexagon as viewed along the vertical direction. The resonator component 2 includes a top surface, a bottom surface opposite to the top surface and six outer side surfaces 21 perpendicular to the base 1. However, in other embodiments, the resonator component 2 can be shaped of other regular polygons, such as a regular triangle as shown in FIGS. 2 and 4. The driving electrodes 3 are located averagely and symmetrically around the resonator component 2 along a circumferential direction of the inscribed circle of the resonator component 2. The driving electrodes 3 are separated from each other along the circumferential direction with the same distance and the same angle. Numbers of the fixing portions 4 and the driving electrodes 3 are the same, and the fixing portions 4 and the driving electrodes 3 are alternatively arranged with each other. The fixing portions 4 are connected to each corner of the regular hexagon resonator component 2. With the six fixing portions 4, vertical oscillation, horizontal translation, and torsion can be well restricted. However, the fixing portions 4 can be set in other numbers such as three, as shown in FIGS. 2 and 4. After mass testing, with more than two fixing portions 4 comparing with the two fixing portions which only fix the resonator component 2 at two ends, the harmonic response of the resonator component 2 working under the transverse extension model is found much stable.

Referring to FIGS. 5 to 11, according to the illustrated embodiments of the present invention, the fixing portions 4 and the resonator component 2 are made of the same single-crystalline silicon material. During fabricating, the fixing portions 4 and the resonator component 2 are integral with each other. A single-crystalline silicon layer 101 is formed on the top surface 11 of the base 1 via a bonding process. Then, the thickness of the single-crystalline silicon layer 101 is reduced to a suitable thickness via a silicon chip thinning process so as to set the suspended resonator component 2. As a result, stable and single oscillation model under condition that the resonator component 2 is only expandable or contractible in the horizontal plane can be realized. The thickness of the resonator component 2 along the vertical direction is no larger than a distance between a center of the regular hexagon and each lateral side of the regular hexagon. Thereafter, a plurality of single-crystalline silicon trenches 102 for setting the driving electrodes 3 are formed through a top surface of the single-crystalline silicon layer 101 via a dry etching process, and simultaneously, the regular hexagon resonator component 2 and the plurality of fixing portions 4 connecting the resonator component 2 are formed.

Referring to FIG. 1, each driving electrode 3 includes a coupling surface 31 coupling to the corresponding side surface 21 of the resonator component 2 so as to form the electromechanical coupling system. Through the driving electrodes 3 located averagely and symmetrically around the resonator component 2 with equal spacing and angle, force generates from the coupling are along the horizontal direction. The force drives each lateral side of the resonator component 2 the same movement along a radial direction of the inscribed circle, which will make the generating transverse extension much stable. According to the illustrated embodiments of the present invention, the coupling surfaces 31 and the side surfaces 21 are all curved surfaces with the same curvature radius, and the curved surfaces extend towards an inner side of the resonator component 2. Under this setting, even if the driving electrodes 3 and the resonator component 2 exist slight offset or non-parallel, the curved surfaces can resolve nonideal electrostatic force in every direction so as to maximum the force perpendicular directing to the centre of the resonator component 2 while decreasing other force in other directions after the above force resolution. As a result, negative effects of the coupling force in the other directions can be greatly eliminated. With the force maximally centralized directing to the centre of the resonator component 2, it is much better to stabilize the oscillation model and frequency, and process tolerance of the transverse acoustic wave resonator can be improved with such structure. Besides, it is obvious to those of ordinary skill in the art that the coupling surfaces 31 and the side surfaces 21 can be formed with flat surfaces or other configurations.

According to the illustrated embodiments of the present invention, as shown in FIGS. 1 and 5, each slight gap 5 is formed between each side surface 21 of the driving electrode 3 and the corresponding side surface 31 of the resonator component 2, and each slight gap 5 is within a range of 100 nm to 300 nm.

Figure 6:
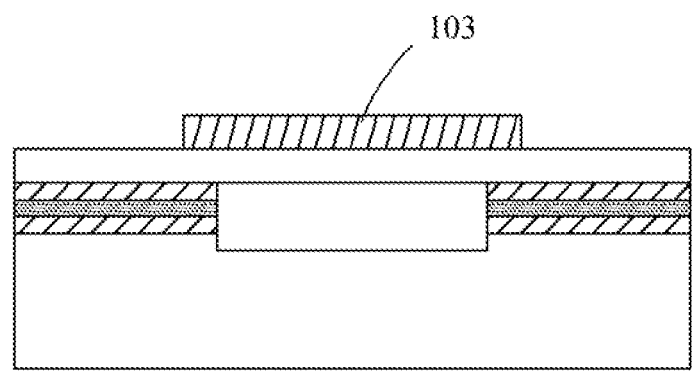
FIG. 6 is a schematic cross-sectional view taken along line A-A of FIG. 1 showing S4 step of the method.
Figure 7:
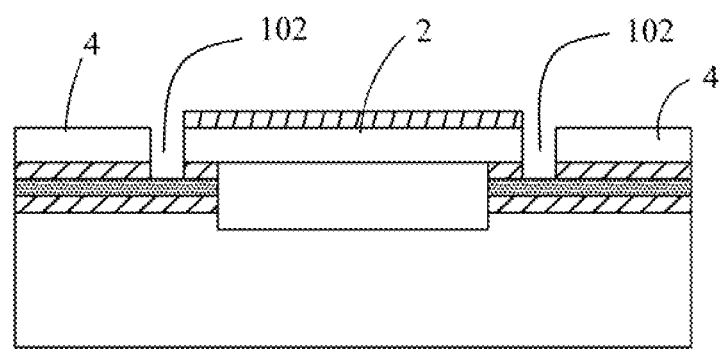
FIG. 7 is a schematic cross-sectional view taken along line A-A of FIG. 1 showing S5 step of the method.
Figure 8:
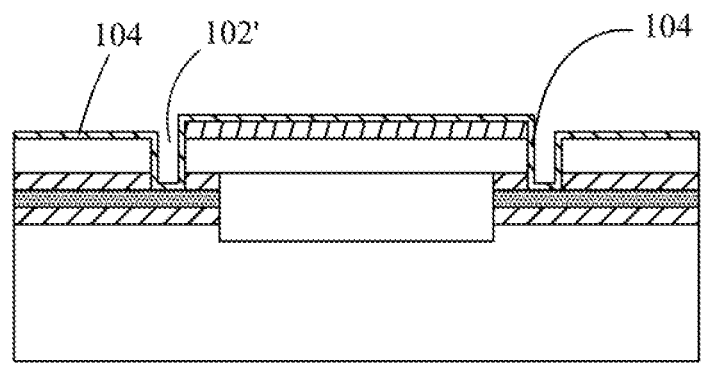
FIG. 8 is a schematic cross-sectional view taken along line A-A of FIG. 1 showing S6 step of the method.
Figure 9:
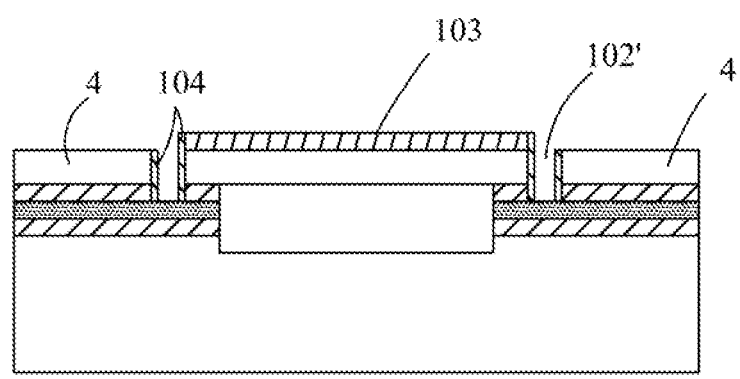
FIG. 9 is a schematic cross-sectional view taken along line A-A of FIG. 1 showing S7 step of the method.
Figure 10:
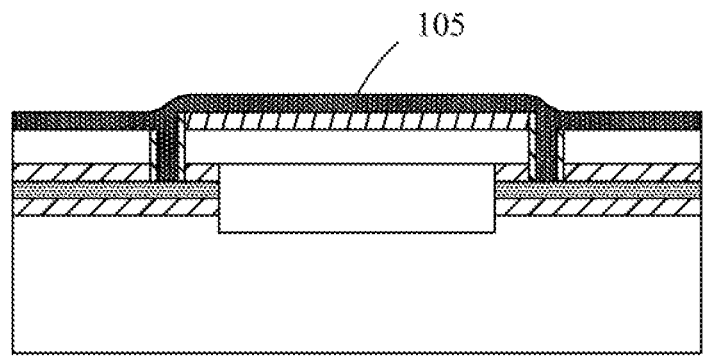
FIG. 10 is a schematic cross-sectional view taken along line A-A of FIG. 1 showing S8 step of the method.
Figure 11:
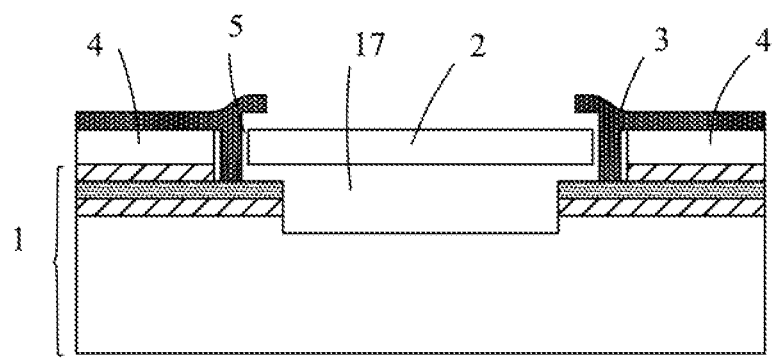
FIG. 11 is a schematic cross-sectional view taken along line A-A of FIG. 1 showing S9 step of the method.

Referring to FIGS. 5 to 11, a method for fabricating the transverse acoustic wave resonator is disclosed with the following steps:

S1: referring to FIG. 5, using single-crystalline silicon as the substrate 13 and forming a dielectric layer on a top surface of the substrate 13 via a deposition process, the dielectric layer being comprised of a first oxide layer 14, a second oxide layer 16 and an insulating layer 15 sandwiched between the first oxide layer 14 and the second oxide layer 16;

S2: referring to FIG. 5, removing part of the dielectric layer on a top surface 11 of the base 1 via an etching process, and then etching the substrate 13 to form a cavity 17;

S3: referring to FIG. 5, forming another single-crystalline silicon layer 101 on the top surface 11 of the base 1 via a bonding process, the thickness of the another single-crystalline silicon layer 101 being reduced to a suitable thickness via a silicon chip thinning process so as to form the suspended resonator component 2 under condition that, for best effects, the above thickness is no larger than a distance between a center of a regular hexagon of the resonator component 2 and each lateral side of the regular hexagon;

S4: referring to FIG. 6, forming a protective layer 103 on the top surface 11 of the another single-crystalline silicon layer 101 via a deposition process, the protective layer 103 being formed in a demanded shape the same as the resonator component 2, the protective layer 103 being an oxide layer;

S5: referring to FIG. 7, etching to form a plurality of single-crystalline silicon trenches 102 from the top surface of the another single-crystalline silicon layer 101 via a dry etching process, and simultaneously, forming the regular polygon resonator component 2 and a plurality of fixing portions 4 connecting the resonator component 2, the resonator component 2 being located above the cavity 17, the single-crystalline silicon trenches 102 being adapted for setting a plurality of driving electrodes 3, the single-crystalline silicon trenches 102 and the fixing portions 4 being located peripherally around the resonator component 2, the fixing portions 4 being connected to the corners of the regular polygon;

S6: referring to FIG. 8, forming a sacrificial layer 104 on an inner side of each single-crystalline silicon trench 102 via a deposition process and an etching process, a thickness of the sacrificial layer 104 being the same as a slight gap 5 between each driving electrode 3 and the resonator component 2, the thickness of the sacrificial layer 104 being within a range of 100 nm to 300 nm;

S7: referring to FIG. 9, removing the sacrificial layer 104 which is on top of the fixing portions 4 and the protective layer 103 via a dry etching process;

S8: referring to FIG. 10, forming a polycrystalline-silicon layer 105 on a top surface of a semi-finished product of step S7 via a deposition process under condition that the polycrystalline-silicon layer 105 fills in the remained single-crystalline silicon trenches 102' because of the excellent conformity of the deposition process;

S9: releasing the resonator component 2 to get the structure as shown in FIG. 11 by removing the polycrystalline-silicon layer 105 which is located on top of the resonator component 2 via an etching process, by removing the dielectric layer under the resonator component 2 via a corrosion process, and by removing the sacrificial layer 104 and the protective layer 103 both of which are located below the resonator component 2, in the step S9, buffer oxide etcher (BOE) being applied in the corrosion process.

In the above steps S1 to S9, some steps such as the step 2, the step 4 and the step 7 can be omitted. Besides, the deposition process is Low Pressure Chemical Vapor Deposition (LPCVD), or Plasma Chemical Vapour Deposition (PCVD), or thermal oxidation. The etching process includes photo etching technology and dry etching technology.

Referring to FIGS. 2 to 4, a second embodiment of the present invention discloses another capacitive-type transverse extension acoustic wave silicon oscillator which is similar to that of the first embodiment as shown in FIGS. 1 and 3. The differences between them are that, in the second embodiment, the shape of the resonator component 2 is regular triangle and the numeral of the fixing portions 4 is three. It is easy to those of ordinary skill in the art to understand that the another capacitive-type transverse extension acoustic wave silicon oscillator and corresponding method for fabricating the transverse acoustic wave resonator, repeated description thereabout is omitted herein.

According to the illustrated embodiments of the present invention, displacement of the resonator component 2 along a top-to-bottom direction and a left-to-right direction can be restricted by the fixing portions 4. With the resonator component 2 set along the vertical direction, when the electromechanical coupling system is driven by external force to get work, the resonator component 2 can be restricted to deform essentially in a horizontal plane, so that the oscillation model of the resonator component 2 is single and stable. As a result, the oscillator with such structure can be provided with high quality and low resonance impedance so as to keep stable working status. Besides, the transverse acoustic wave resonator is fabricated by special MEMS processes including the etching process from the top surface of the single-crystalline silicon, the deposition process, the bonding process, the wet corrosion process etc. to produce the suspended resonator component 2, the fixing portions 4 and the driving electrodes 3 with nanoscale gap. As a result, the height and the thickness of the suspended resonator component 2 and the gap of the driving electrodes 3 can be well controlled through the above MEMS processes.

It is to be understood, however, that even though numerous, characteristics and advantages of the present invention have been set forth in the foregoing description, together with details of the structure and function of the invention, the disclosed is illustrative only, and changes may be made in detail, especially in matters of number, shape, size, and arrangement of parts within the principles of the invention to the full extent indicated by the broadest general meaning of the terms in which the appended claims are expressed.

What is claimed is:

1. A transverse acoustic wave resonator comprising:
   a base comprising a top surface and a bottom surface;
   a resonator component suspended above the top surface of the base along a vertical direction which is perpendicular to the base, the resonator component comprising a plurality of side surfaces;
   a plurality of driving electrodes fixed to the base and coupling to the side surfaces of the resonator component; and
   a plurality of fixing portions connecting the base and the resonator component; wherein
   the resonator component is formed in a shape of an essential regular polygon as viewed along the vertical direction; and wherein
   the driving electrodes and the resonator component jointly form an electromechanical coupling system for converting capacitance into electrostatic force so as to oscillate the resonator component; wherein
   the plurality of fixing portions respectively extend away from the resonator component and are coplanar with the resonator component.

2. The transverse acoustic wave resonator as claimed in claim 1, wherein the regular polygon is a regular hexagon or a regular triangle.

3. The transverse acoustic wave resonator as claimed in claim 1, wherein a thickness of the resonator component is no larger than a distance between a centre of the regular polygon and each lateral side of the regular polygon.

4. The transverse acoustic wave resonator as claimed in claim 1, wherein a slight gap is formed between each driving electrode and the resonator component, and the slight gap is within a range of 100 nm to 300 nm.

5. The transverse acoustic wave resonator as claimed in claim 1, wherein the driving electrodes are equidistantly located around the resonator component.

6. The transverse acoustic wave resonator as claimed in claim 1, wherein the number of the fixing portions and the driving electrodes are the same.

7. The transverse acoustic wave resonator as claimed in claim 1, wherein the resonator component comprises a plurality of corners, the fixing portions are located at the corners and equidistantly to the driving electrodes.

8. The transverse acoustic wave resonator as claimed in claim 1, wherein each driving electrode defines a coupling surface coupling to the corresponding side surface in parallel manner, and each coupling surface is perpendicular to the base.

9. The transverse acoustic wave resonator as claimed in claim 8, wherein the side surfaces and the coupling surfaces are flat surfaces, or the side surfaces and the coupling surfaces are arced surfaces which extend towards an inner side of the resonator component.

10. The transverse acoustic wave resonator as claimed in claim 1, wherein the base comprises a substrate, a first oxide layer covering the substrate, an insulating layer covering the first oxide layer, a second oxide layer covering the insulating layer, and a cavity recessed into the substrate through the first oxide layer, the insulating layer and the second oxide layer.

11. The transverse acoustic wave resonator as claimed in claim 10, wherein the cavity extends through the top surface of the base and is located under the resonator component.

12. The transverse acoustic wave resonator as claimed in claim 1, wherein the resonator component is driven by the driving electrodes to slightly oscillate only in a horizontal plane.

13. An oscillator comprising:
   an energizing circuit;
   a signal processing circuit; and
   a transverse acoustic wave resonator, the transverse acoustic wave resonator comprising:
      a base comprising a top surface and a bottom surface;
      a resonator component suspended above the top surface of the base along a vertical direction, the resonator component comprising a plurality of side surfaces;
      a plurality of driving electrodes fixed to the base and located peripherally around the resonator component, each driving electrode comprising a coupling surface facing the corresponding side surface of the resonator component so that the resonator component is driven by the driving electrodes to slightly oscillate only in a horizontal plane; and
      a plurality of fixing portions connecting the base and the resonator component in order to restrict the resonator component; wherein
      the driving electrodes and the resonator component jointly form an electromechanical coupling system for converting capacitance into electrostatic force so as to oscillate the resonator component;
      the plurality of fixing portions respectively extend away from the resonator component and are coplanar with the resonator component.

14. A method for fabricating a transverse acoustic wave resonator comprising the following steps:
   S1: forming a dielectric layer on a top surface of a single-crystalline silicon via a deposition process;
   S2: forming another single-crystalline silicon on a top surface of the dielectric layer via a bonding process;
   S3: etching to form a plurality of single-crystalline silicon trenches from a top surface of the another single-crystalline silicon via a dry etching process, and simultaneously, forming a regular polygon resonator component and a plurality of fixing portions connecting the resonator component, the single-crystalline silicon trenches being adapted for setting a plurality of driving electrodes, the single-crystalline silicon trenches and the fixing portions being located peripherally around the resonator component, the plurality of fixing portions respectively extending away from the resonator component and being coplanar with the resonator component;
   S4: forming a sacrificial layer on an inner side of each single-crystalline silicon trench via a deposition process and an etching process, a thickness of the sacrificial layer being the same as a gap between each driving electrode and the resonator component;
   S5: forming a polycrystalline-silicon layer on a top surface of a semi-finished product of the step S4 via a deposition process under condition that the polycrystalline-silicon layer fills in the single-crystalline silicon trenches; and
   S6: removing the polycrystalline-silicon layer which is located on top of the resonator component via a corrosion process, and removing the dielectric layer and the sacrificial layer both of which are located below the resonator component.

15. The method as claimed in claim 14, further comprising a following step S21 between the step S2 and the step S3:

S21: forming a protective layer on the top surface of the another single-crystalline silicon via a deposition process, the protective layer being formed in a shape the same as the resonator component; wherein the protective layer is removed together with the dielectric layer and the sacrificial layer in the step S6 via the corrosion process.

16. The method as claimed in claim 15, wherein the protective layer is an oxide layer.

17. The method as claimed in claim 14, wherein in the step S6, buffer oxide etcher (BOE) is applied in the corrosion process.

18. The method as claimed in claim 14, wherein the dielectric layer comprises a first oxide layer, a second oxide layer and an insulating layer located between the first oxide layer and the second oxide layer.

19. The method as claimed in claim 14, further comprising a following step S11 between the step S1 and the step S2:

S11: forming a cavity by removing part of the dielectric layer and further etching the single-crystalline silicon via an etching process, the cavity being located under the resonator component.

20. The method as claimed in claim 14, wherein in the step S2, a thickness of the another single-crystalline silicon is reduced to a suitable thickness via a silicon chip thinning process so as to form the resonator component.

* * * * *